(12) United States Patent
Toyoguchi (10) Patent No.: US 10,818,708 B2
(45) Date of Patent: Oct. 27, 2020

(54) SOLID-STATE IMAGING DEVICE AND IMAGING SYSTEM

(71) Applicant: CANON KABUSHIKI KAISHA, Tokyo (JP)

(72) Inventor: Ginjiro Toyoguchi, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/506,111

(22) Filed: Jul. 9, 2019

(65) Prior Publication Data

US 2020/0035722 A1 Jan. 30, 2020

(30) Foreign Application Priority Data

Jul. 30, 2018 (JP) ................. 2018-142744

(51) Int. Cl.
| | |
|---|---|
| *H01L 27/146* | (2006.01) |
| *H04N 5/335* | (2011.01) |
| *G06T 7/55* | (2017.01) |
| *H04N 5/359* | (2011.01) |

(52) U.S. Cl.
CPC ......... *H01L 27/1461* (2013.01); *G06T 7/55* (2017.01); *H01L 27/1463* (2013.01); *H01L 27/14643* (2013.01); *H04N 5/359* (2013.01); *G06T 2207/30252* (2013.01)

(58) Field of Classification Search
CPC .......... H01L 27/1461; H01L 27/14643; H01L 27/1463; H01L 27/14612; G06T 7/55; G06T 2207/30252; H04N 5/359

USPC ........................................................ 348/135
See application file for complete search history.

(56) References Cited

U.S. PATENT DOCUMENTS

| | | | |
|---|---|---|---|
| 8,357,956 B2* | 1/2013 | Kobayashi ........ | H01L 27/14603 257/225 |
| 8,697,477 B2* | 4/2014 | Ha ................... | H01L 27/14616 257/443 |
| 8,710,559 B2* | 4/2014 | Kobayashi ......... | H01L 27/1461 257/290 |

(Continued)

FOREIGN PATENT DOCUMENTS

| | | |
|---|---|---|
| JP | 2010-192483 | 9/2010 |
| JP | 2011-253962 | 12/2011 |

(Continued)

*Primary Examiner* — Susan E. Hodges
(74) *Attorney, Agent, or Firm* — Venable LLP (57) ABSTRACT

A photoelectric conversion unit includes first, second, and third semiconductor regions having first, second, and first conductivity types, respectively. A fourth semiconductor region between the first and third semiconductor regions at the same depth as the second semiconductor region. A charge holding portion includes a fifth semiconductor region of the first conductivity type. A transfer transistor has a region between the first and fifth semiconductor regions as a channel portion. A pixel isolation portion includes a sixth semiconductor region of the second conductivity type between the third semiconductor regions of adjacent pixels. A relationship V6>V5>V4 is satisfied, where a potential of the fourth semiconductor region to charges is V4, a potential of a region having the highest potential to charges in the channel portion with the transfer transistor being in an off-state is V5, and a potential of the sixth semiconductor region to charges is V6.

20 Claims, 8 Drawing Sheets

(56) References Cited

U.S. PATENT DOCUMENTS

| | | | |
|---|---|---|---|
| 8,716,719 B2* | 5/2014 | Matsumura | H01L 27/14612 |
| | | | 257/293 |
| 8,921,900 B2 | 12/2014 | Iida | |
| 9,124,833 B2 | 9/2015 | Toyoguchi | |
| 9,231,007 B2 | 1/2016 | Hynecek | |
| 9,548,328 B2 | 1/2017 | Hasegawa | |
| 10,381,388 B2 | 8/2019 | Toyoguchi | |
| 2010/0207231 A1 | 8/2010 | Iwamoto | |
| 2011/0241079 A1* | 10/2011 | Oike | H01L 27/14616 |
| | | | 257/225 |
| 2011/0298022 A1 | 12/2011 | Ha | |
| 2018/0114811 A1* | 4/2018 | Sato | H01L 27/1463 |
| 2018/0184027 A1* | 6/2018 | Shinohara | H01L 27/14607 |
| 2018/0350864 A1* | 12/2018 | Toyoguchi | H01L 27/1461 |
| 2018/0374886 A1 | 12/2018 | Iwata | |

FOREIGN PATENT DOCUMENTS

| | | |
|---|---|---|
| JP | 2013-41875 | 2/2013 |
| JP | 2014-165286 | 9/2014 |
| JP | 2018-107409 | 7/2018 |

* cited by examiner

SOLID-STATE IMAGING DEVICE AND IMAGING SYSTEM

BACKGROUND OF THE INVENTION

Field of the Invention

The present invention relates to a solid-state imaging device and an imaging system.

Description of the Related Art

In solid-state imaging devices represented by a CCD image sensor or a CMOS image sensor, sensitivity and a saturation charge amount of a photoelectric conversion unit are important characteristics that determine the performance of the solid-state imaging device.

Japanese Patent Application Laid-Open No. 2014-165286 discloses a solid-state imaging device in which a charge accumulation capacitance of a photoelectric conversion unit is increased by providing a p-type semiconductor region directly under an n-type semiconductor region forming a charge accumulation region of the photoelectric conversion unit. In Japanese Patent Application Laid-Open No. 2014-165286, by providing an opening in a portion of the p-type semiconductor region directly under the charge accumulation region and enabling charges generated at a deeper portion of a semiconductor substrate to be collected in the charge accumulation region via the opening, it is possible to increase the saturation signal amount without losing sensitivity.

SUMMARY OF THE INVENTION

According to one aspect of the present invention, provided is a solid-state imaging device including: a plurality of pixels each including a photoelectric conversion unit that generates charges by photoelectric conversion, a charge holding portion that holds charges transferred from the photoelectric conversion unit, and a transfer transistor; and a pixel isolation portion provided between each of the plurality of pixels, the photoelectric conversion unit includes a first semiconductor region of a first conductivity type provided on a semiconductor substrate and configured to accumulate generated charges, a second semiconductor region of a second conductivity type provided under the first semiconductor region, and a third semiconductor region of the first conductivity type provided under the second semiconductor region and having a lower impurity concentration than the first semiconductor region, the first semiconductor region is electrically connected to the third semiconductor region via a fourth semiconductor region provided at the same depth as the second semiconductor region, the charge holding portion includes a fifth semiconductor region of the first conductivity type, the transfer transistor has a region between the first semiconductor region and the fifth semiconductor region as a channel portion, the pixel isolation portion includes a sixth semiconductor region of the second conductivity type provided between the third semiconductor region of one of the plurality of pixels and the third semiconductor region of a pixel adjacent to the one of the plurality of pixels, and a relationship of $V6>V5>V4$ is satisfied, where a potential of the fourth semiconductor region to the charges is $V4$, a potential of a region having the highest potential to the charges in the channel portion with the transfer transistor being in an off-state is $V5$, and a potential of the sixth semiconductor region to the charges is $V6$.

Further features of the present invention will become apparent from the following description of exemplary embodiments with reference to the attached drawings.

DESCRIPTION OF THE EMBODIMENTS

In the solid-state imaging device disclosed in Japanese Patent Application Laid-Open No. 2014-165286, while a high sensitivity and a large saturation charge amount can be realized, charges generated at a deeper portion than the p-type semiconductor region may not be collected in a charge accumulation region and may flow into the adjacent pixel. The charges flowing into the adjacent pixel may cause an erroneous signal and may degrade an image.

A technology described below relates to a solid-state imaging device and an imaging system that can effectively suppress an erroneous signal due to charges flowing from adjacent pixel and acquire a high quality image.

First Embodiment

Figure 1:
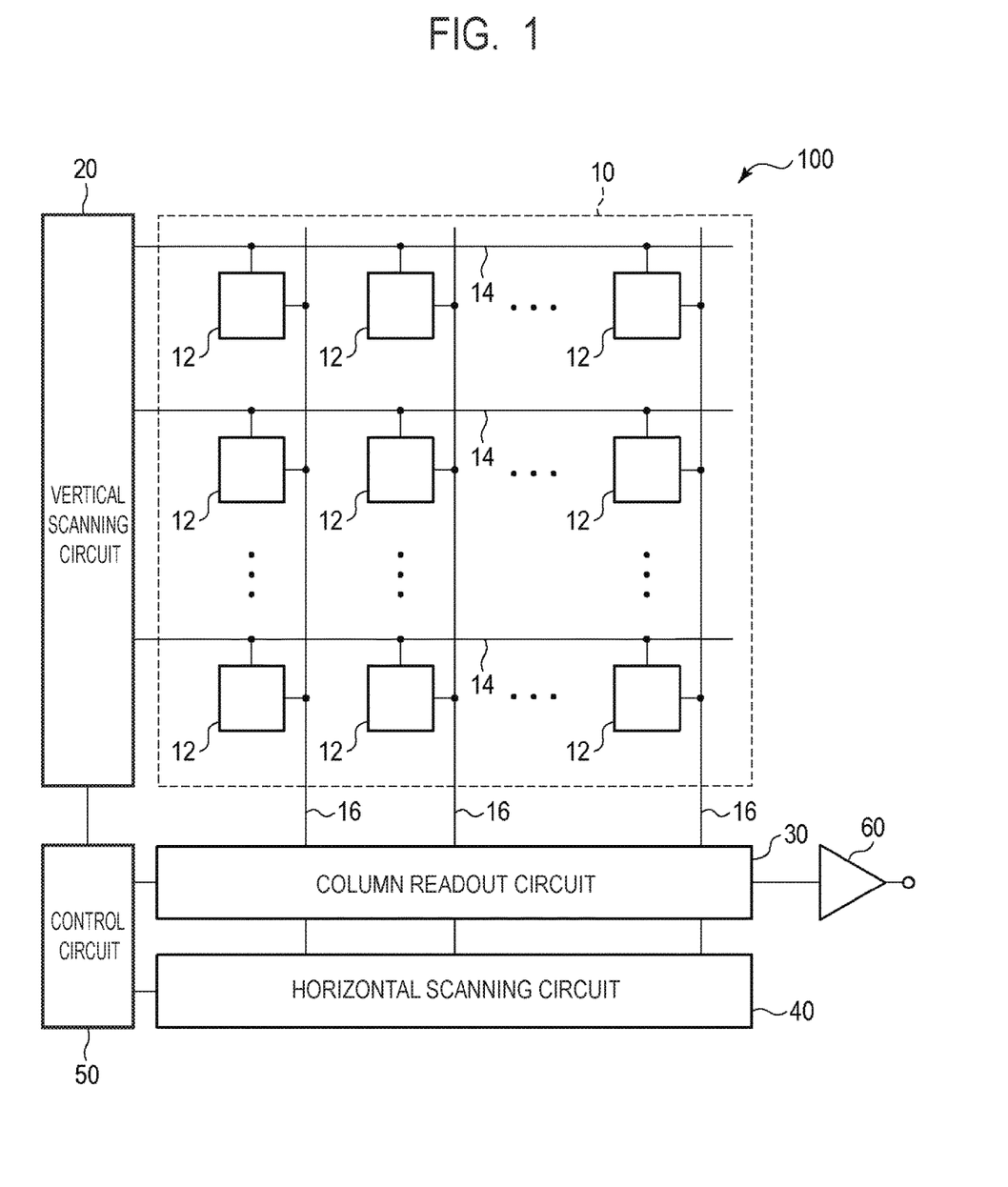
FIG. 1 is a block diagram illustrating the general configuration of a solid-state imaging device according to a first embodiment of the present invention.
Figure 2:
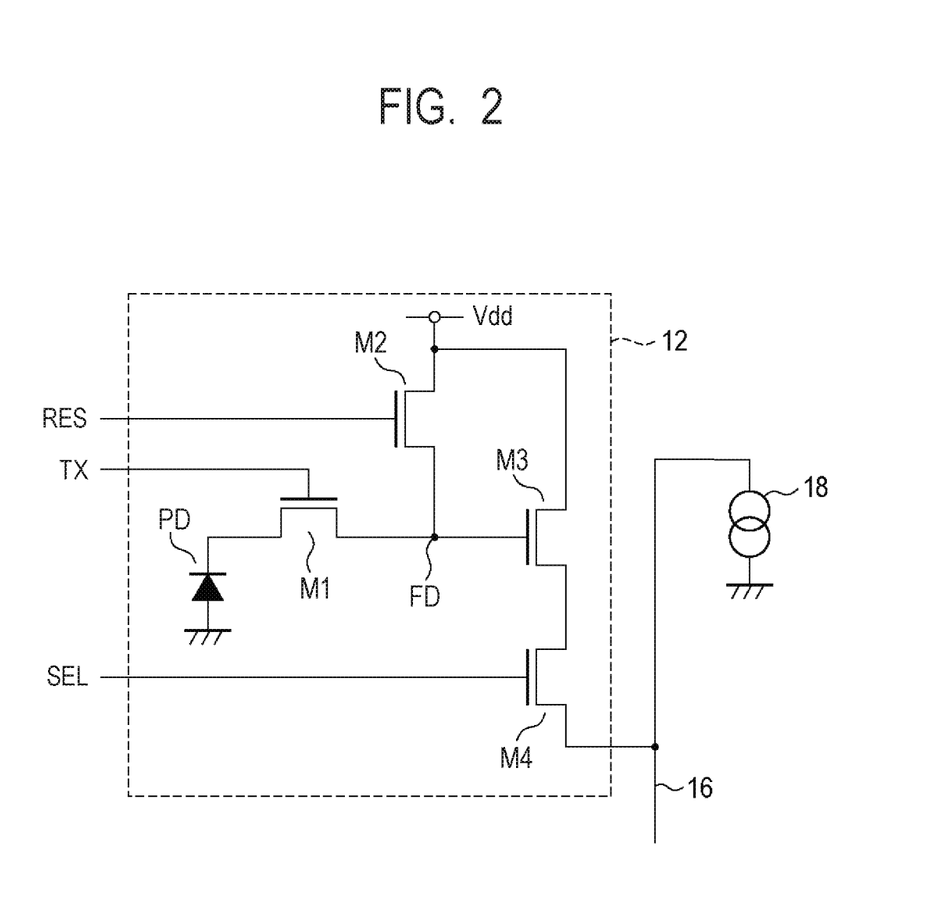
FIG. 2 is a circuit diagram illustrating a configuration example of a pixel of the solid-state imaging device according to the first embodiment of the present invention.
Figure 3:
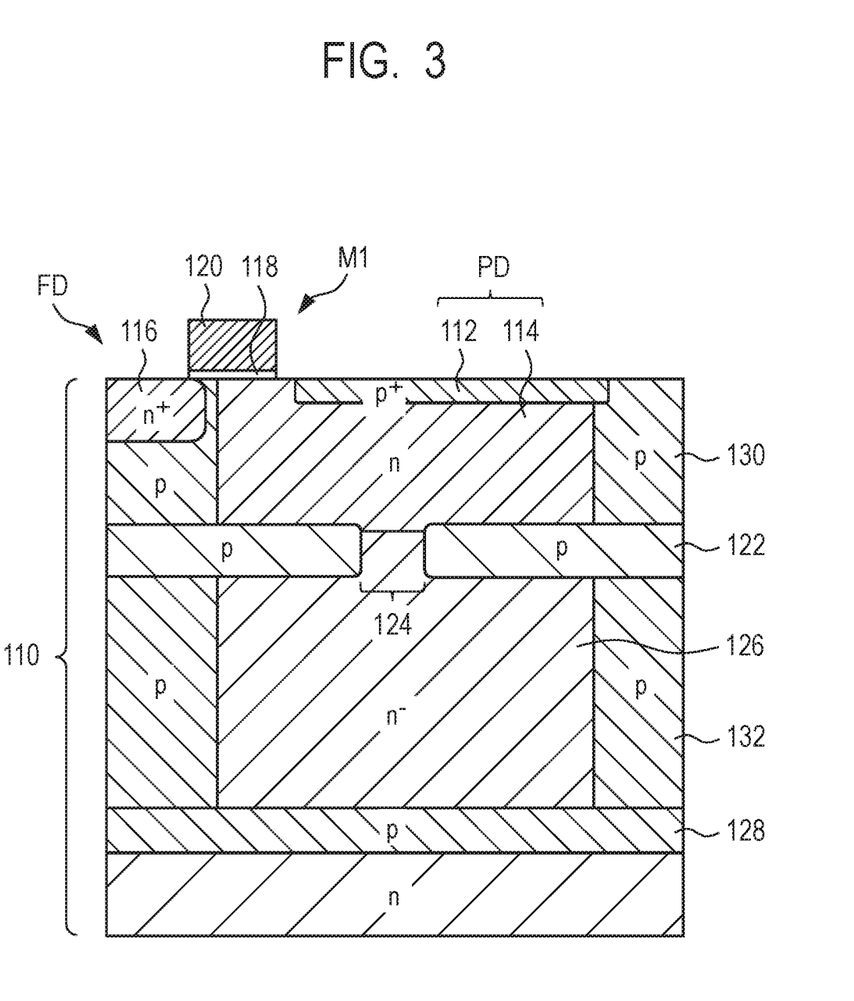
FIG. 3 is a schematic cross-sectional view illustrating the structure of the pixel of the solid-state imaging device according to the first embodiment of the present invention.
Figure 4:
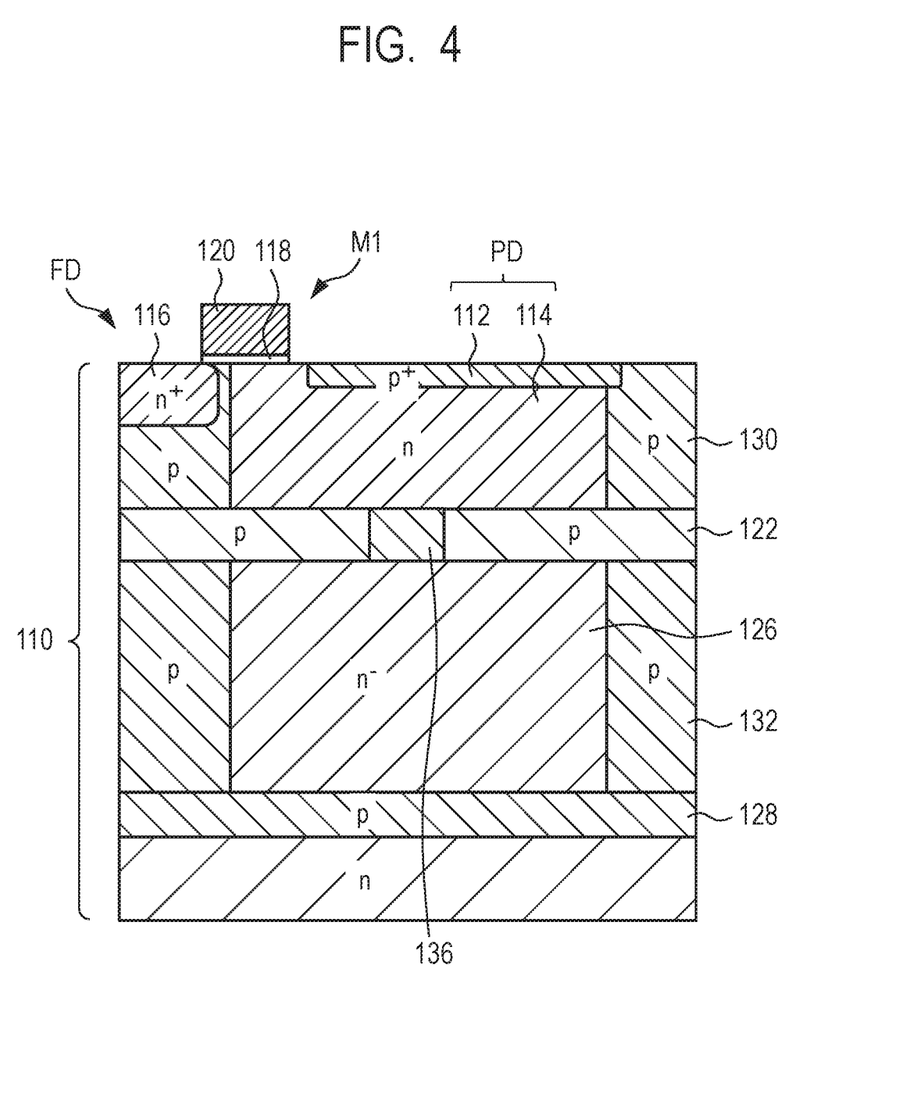
FIG. 4 is a general cross-sectional view illustrating the structure of the pixel of the solid-state imaging device according to a modified example of the first embodiment of the present invention.
Figure 5:
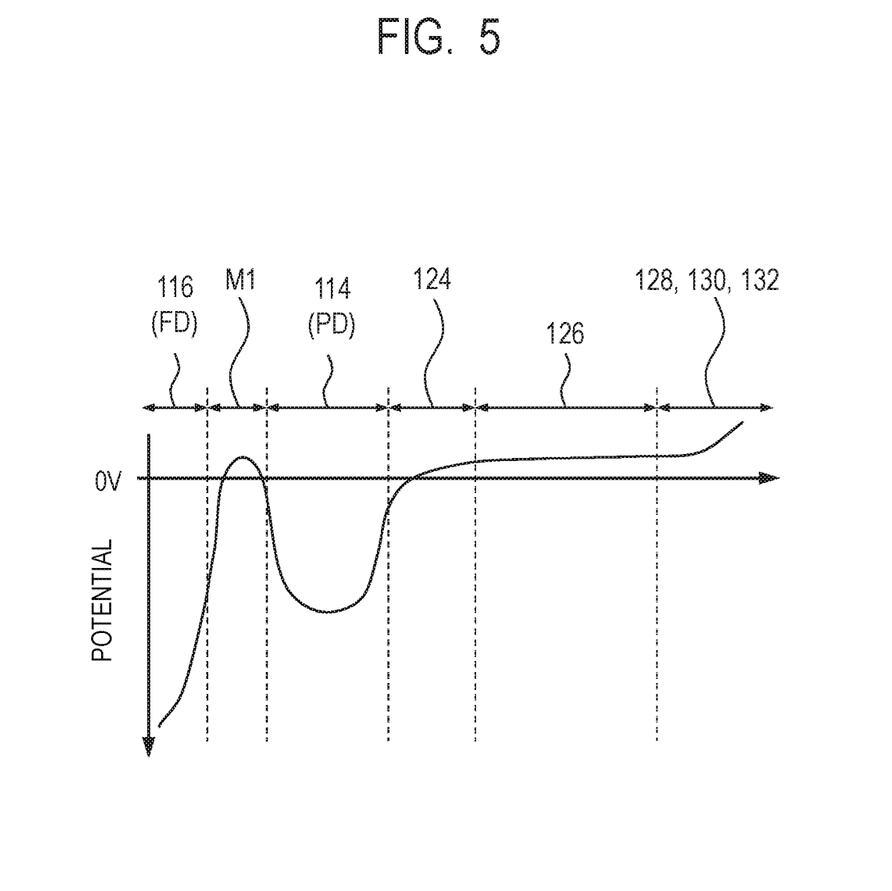
FIG. 5 is a potential diagram of the pixel of the solid-state imaging device according to the first embodiment of the present invention.

A solid-state imaging device according to a first embodiment of the present invention will be described with reference to FIG. 1 to FIG. 5. FIG. 1 is a block diagram illustrating the general configuration of a solid-state imaging device according to the present embodiment. FIG. 2 is a circuit diagram illustrating a configuration example of a pixel of the solid-state imaging device according to the present embodiment. FIG. 3 is a schematic cross-sectional view illustrating the structure of the pixel of the solid-state imaging device according to the present embodiment. FIG. 4 is a general cross-sectional view illustrating the structure of the pixel of the solid-state imaging device according to a modified example of the present embodiment. FIG. 5 is a potential diagram of the pixel of the solid-state imaging device according to the present embodiment.

As illustrated in FIG. 1, a solid-state imaging device 100 according to the present embodiment includes a pixel region 10, a vertical scanning circuit 20, a column readout circuit 30, a horizontal scanning circuit 40, a control circuit 50, and an output circuit 60.

In the pixel region 10, a plurality of pixels 12 arranged in a matrix over a plurality of rows and a plurality of columns are provided. Each of the pixels 12 includes a photoelectric conversion unit formed of a photoelectric conversion element such as a photodiode and outputs a pixel signal corresponding to a light amount of an incident light. The number of rows and the number of columns of pixel arrays arranged in the pixel region 10 are not particularly limited. Further, in addition to an effective pixel which outputs a pixel signal corresponding to a light amount of an incident light, an optical black pixel in which the photoelectric conversion unit is light-shielded, a dummy pixel that does not output a signal, or the like may be arranged in the pixel region 10.

On each row of the pixel arrays in the pixel region 10, a control line 14 is arranged extending in a first direction (the horizontal direction in FIG. 1). Each control line 14 is connected to the pixels 12 aligned in the first direction, respectively, to form a signal line common to these pixels 12. The first direction in which the control line 14 extends may be referred to as a row direction or the horizontal direction. The control line 14 is connected to the vertical scanning circuit 20.

On each column of the pixel arrays of the pixel region 10, an output line 16 is arranged extending in a second direction (the vertical direction in FIG. 1) crossing the first direction. Each output line 16 is connected to the pixels 12 aligned in the second direction, respectively, to form a signal line common to these pixels 12. The second direction in which the output line 16 extends may be referred to as a column direction or the vertical direction. The output line 16 is connected to the column readout circuit 30.

The vertical scanning circuit 20 is a control circuit unit that supplies, to the pixel 12 via the control line 14 provided for each row of the pixel array, control signals used for driving the readout circuit inside the pixel 12 when a signal is read out from the pixel 12. The vertical scanning circuit 20 may be formed by using a shift register or an address decoder. The signal read out from the pixel 12 on a row-by-row basis is input to the column readout circuit 30 via the output line 16 provided for each column of the pixel array.

The column readout circuit 30 is a circuit unit that performs predetermined signal processing such as signal processing, for example, an amplifying process, an analog-to-digital (A/D) conversion process, or the like on a signal read out from the pixel 12 on each column via the output line 16. The column readout circuit 30 may include a signal holding unit, a column amplifier, a correlated double sampling (CDS) circuit, an addition circuit, an A/D conversion circuit, a column memory, or the like.

The horizontal scanning circuit 40 is a circuit unit that supplies, to the column readout circuit 30, control signals used for sequentially transferring the signal processed in the column readout circuit 30 to the output circuit 60 on a column-by-column basis. The horizontal scanning circuit 40 may be formed by using a shift register or an address decoder. The output circuit 60 is formed of a buffer amplifier, a differential amplifier, or the like and is a circuit unit for amplifying and outputting a column signal selected by the horizontal scanning circuit 40.

The control circuit 50 is a circuit unit used for supplying, to the vertical scanning circuit 20, the column readout circuit 30, and the horizontal scanning circuit 40, control signals that control an operation or the timing thereof. Some or all of the control signals supplied to the vertical scanning circuit 20, the readout circuit 30, and the horizontal scanning circuit 40 may be supplied from the external of the solid-state imaging device 100.

As illustrated in FIG. 2, each of the pixels 12 includes a photoelectric conversion unit PD, a transfer transistor M1, a reset transistor M2, an amplifier transistor M3, and a select transistor M4.

The photoelectric conversion unit PD is, for example, a photodiode, the anode thereof is connected to the ground node, and the cathode thereof is connected to the source of the transfer transistor M1. The drain of the transfer transistor M1 is connected to the source of the reset transistor M2 and the gate of the amplifier transistor M3. A connection node of the drain of the transfer transistor M1, the source of the reset transistor M2, and the gate of the amplifier transistor M3 is a so-called floating diffusion portion FD. The floating diffusion portion FD includes a capacitance component (floating diffusion capacitance) and has a function as a charge holding portion.

The drain of the reset transistor M2 and the drain of the amplifier transistor M3 are connected to a power supply node to which a voltage Vdd is supplied. The source of the amplifier transistor M3 is connected to the drain of the select transistor M4. The source of the select transistor M4 is connected to the output line 16. The output line 16 is connected to a current source 18.

In the case of the pixel configuration illustrated in FIG. 2, the control line 14 on each row arranged in the pixel region 10 includes a transfer gate signal line TX, a reset signal line RES, and a select signal line SEL. The transfer gate signal line TX is connected to the gates of the transfer transistors M1 of the pixels 12 belonging to the corresponding row. The reset signal line RES is connected to the gates of the reset transistors M2 of the pixels 12 belonging to the corresponding row. The select signal line SEL is connected to the gates of the select transistors M4 of the pixels 12 belonging to the corresponding row.

The photoelectric conversion unit PD converts (photoelectrically converts) an incident light to an amount of charges corresponding to the light amount of the incident light and accumulates generated charges. When turned on, the transfer transistor M1 transfers charges held by the photoelectric conversion unit PD to the floating diffusion portion FD. The floating diffusion portion FD has a voltage corresponding to the amount of the charges transferred from the photoelectric conversion unit PD by charge-voltage conversion by the capacitance component. The amplifier transistor M3 is configured such that the voltage Vdd is supplied to the drain and a bias current is supplied to the source from the current source 18 via the select transistor M4 and forms an amplifier unit in which the gate is the input node (source follower circuit). Thereby, the amplifier transistor M3 outputs a signal based on the voltage of the floating diffusion portion FD to the output line 16 via the select transistor M4. When turned on, the reset transistor M2 resets the floating diffusion portion FD to a voltage corresponding to the voltage Vdd.

FIG. 3 is a partial cross-sectional view of the pixel 12 in the solid-state imaging device according to the present embodiment. FIG. 3 illustrates a cross-sectional view of a portion corresponding to a transfer path of signal charges from the photoelectric conversion unit PD to the floating diffusion portion FD. The description of the reset transistor M2, the amplifier transistor M3, and the select transistor M4 that do not appear on the cross section will be omitted here.

As illustrated in FIG. 3, the photoelectric conversion unit PD, the transfer transistor M1, and the floating diffusion portion FD are provided in the surface portion of an n-type semiconductor substrate 110.

The photoelectric conversion unit PD is a buried photodiode including a p-type semiconductor region 112 (tenth semiconductor region) provided in the surface portion of the semiconductor substrate 110 and an n-type semiconductor region 114 (first semiconductor region) provided under the p-type semiconductor region 112. The n-type semiconductor region 114 forms a p-n junction between the n-type semiconductor region 114 and the p-type semiconductor region 112. The n-type semiconductor region 114 serves as a charge accumulation layer for accumulating signal charges (electrons) generated in the photoelectric conversion unit PD. The floating diffusion portion FD is formed of an n-type semiconductor region 116 (fifth semiconductor region) provided in the surface of the semiconductor substrate 110 so as to be separated from the n-type semiconductor region 114.

A gate electrode 120 is provided over the semiconductor substrate 110 between the n-type semiconductor region 114 and the n-type semiconductor region 116 with a gate insulating film 118 interposed therebetween. Thereby, the transfer transistor M1 including the n-type semiconductor region 114 as a source, the n-type semiconductor region 116 as a drain, and the gate electrode 120 as a gate is formed.

A p-type semiconductor region 122 (second semiconductor region) is provided under the n-type semiconductor region 114. The p-type semiconductor region 122 serves as a depletion suppression layer for suppressing a depletion layer from expanding downward from the n-type semiconductor region 114. At least a part of the region of the n-type semiconductor region 114 overlaps with a region (represented as a gap 124 in FIG. 3) where the p-type semiconductor region 122 is not provided in a plan view. That is, the n-type semiconductor region 114 has a region not overlapping with the p-type semiconductor region 122 in a plan view and a region overlapping with the p-type semiconductor region 122 in a plan view. The region in which the n-type semiconductor region 114 overlaps with the gap 124 in a plan view is preferably arranged in a portion in which the electric potential of the n-type semiconductor region 114 is the highest, which is typically in the center of the n-type semiconductor region 114 in a plan view.

An n-type semiconductor region 126 (third semiconductor region) having a lower impurity concentration than the n-type semiconductor region 114 is provided under the p-type semiconductor region 122. The n-type semiconductor region 126 is electrically connected to the n-type semiconductor region 114 via the gap 124.

Note that, while typically being a portion of the n-type semiconductor region 114 and/or the n-type semiconductor region 126, the portion of the gap 124 may be referred to as an n-type semiconductor region (fourth semiconductor region) provided at the same depth as the p-type semiconductor region 122 for simplified illustration in the present specification.

Further, the semiconductor region (fourth semiconductor region) is not necessarily required to be an n-type semiconductor region and, as illustrated in FIG. 4, for example, may be a p-type semiconductor region (p-type semiconductor region 136). In this case, with a portion of the p-type semiconductor region 122 (p-type semiconductor region 136) being depleted, the n-type semiconductor region 114 and the n-type semiconductor region 126 can be electrically conducted. In this case, the p-type semiconductor region 122 and the p-type semiconductor region 128 can be formed by an ion implantation by using the same mask. That is, compared to the ion implantation condition for forming the p-type semiconductor region 128, a weaker ion implantation condition is used (typically, an acceleration voltage is reduced) for forming the p-type semiconductor region 122. Thus, compared to a case where a mask different from the mask used for forming the p-type semiconductor region 128 is used for forming the p-type semiconductor region 122, the number of masks can be reduced.

The p-type semiconductor region 128 (eighth semiconductor region) is provided under the n-type semiconductor region 126. The p-type semiconductor region 128 defines a depth at which signal charges generated in the semiconductor substrate 110 are effectively collected. Further, the p-type semiconductor region 128 is responsible for preventing charges generated in the n-type semiconductor region 126 from leaking to an adjacent pixel (not illustrated) through a deeper portion of the semiconductor substrate 110.

A p-type semiconductor region 130 (seventh semiconductor region) is provided between the p-type semiconductor region 112 and the n-type semiconductor region 114 and the adjacent pixel (not illustrated). Further, a p-type semiconductor region 132 (sixth semiconductor region) is provided between the n-type semiconductor region 126 and the adjacent pixel (not illustrated). The p-type semiconductor regions 130 and 132 serve as a pixel isolation portion used for isolating the pixels 12 from each other inside the semiconductor substrate 110.

With the p-type semiconductor region 122 being provided under the n-type semiconductor region 114, a p-n junction capacitance is formed between the n-type semiconductor region 114 and the p-type semiconductor region 122. As is clear from a relational expression represented as Q=CV, when a predetermined reverse bias voltage V is applied to the p-n junction of the photoelectric conversion unit PD, a larger p-n junction capacitance C results in a larger accumulation charge amount Q. While signal charges accumulated in the n-type semiconductor region 114 are transferred to a signal output portion, once the electric potential of the n-type semiconductor region 114 reaches a certain electric potential determined by the power source voltage or the like, the signal charges of the n-type semiconductor region 114 are no longer transferred. That is, since the amount of change in the voltage V due to transfer of signal charges is fixed, the saturation charge amount increases proportionally to the p-n junction capacitance of the photoelectric conversion unit PD. Therefore, with the p-type semiconductor region 122 being provided, the saturation charge amount of the n-type semiconductor region 114 as the charge accumulation layer can be increased.

Further, the gap 124 provided in the p-type semiconductor region 122 can be utilized as a traveling path of signal charges between the n-type semiconductor region 126 and the n-type semiconductor region 114. Therefore, with a potential gradient being formed from the n-type semiconductor region 114 to the gap 124 and being formed from the gap 124 to the n-type semiconductor region 114, signal charges generated in the n-type semiconductor region 126 can be effectively collected in the n-type semiconductor region 114. Such a potential gradient can be formed by appropriately setting the size and the shape of the gap 124, the impurity concentration of the n-type semiconductor region 114, and the impurity concentrations and depths of the p-type semiconductor regions 122 and 128. In this case, the potentials of the p-type semiconductor regions 130 and 132 and the potential of the p-type semiconductor region 128 are set higher than the potential of the gap 124.

Further, by appropriately adjusting the distance between the n-type semiconductor regions 114 and 116, it is possible to have the potential in the channel portion of the transfer transistor M1 which is lower than the potentials of the p-type semiconductor regions 128, 130, and 132 and higher than the potential of the gap 124. Therefore, signal charges generated by the n-type semiconductor region 126 can be collected in the n-type semiconductor region 116 of the pixel of interest via the gap 124 and the n-type semiconductor region 114 while leakage to the adjacent pixels is suppressed.

FIG. 5 is a potential diagram when the transfer transistor M1 is in an off-state. In FIG. 5, taking the case where signal charges are electrons into consideration, the direction of the positive electric potential is indicated downward, and the direction of the negative electric potential is indicated upward.

As illustrated in FIG. 5, the potential in the path from the n-type semiconductor region 114 to the p-type semiconductor region 128 or the p-type semiconductor region 132 via the gap 124 and the n-type semiconductor region 126 gradually increases. That is, the potential of the gap 124 is lower than the potentials of the p-type semiconductor regions 128 and 132, and signal charges generated in the n-type semiconductor region 126 move to the gap 124 side along the potential gradient.

Further, while being higher than the potential of the gap 124, the potential between the n-type semiconductor region 114 and the n-type semiconductor region 116, that is, the potential of the channel portion of the transfer transistor M1 is lower than the potentials of the p-type semiconductor regions 128 and 132. Thereby, the signal charges generated in the n-type semiconductor region 114 leak to the n-type semiconductor region 116 of the pixel of interest before moving over the p-type semiconductor region 132 and leaking to the adjacent pixel.

A relationship of V6>V5>V4 is satisfied, where the potential of the portion of the gap 124 to signal charges is V4, the potential of the channel portion of the transfer transistor M1 is V5, and the potential of the portion of the p-type semiconductor region 132 is V6. Further, the potentials V5 and V8 have a relationship of V8>V5, where the potential of the portion of the p-type semiconductor region 128 to signal charges is V8.

For the potential of the channel portion when the transfer transistor M1 is in an off-state, not only the relationship with respect to the potential of the n-type semiconductor regions 114 and 116 but also the relationship with respect to the potential between the n-type semiconductor region 114 and the n-type semiconductor region 114 of another adjacent pixel is important. That is, when the potential of the channel portion of the transfer transistor M1 is higher than the potential between the n-type semiconductor region 114 and the n-type semiconductor region 114 of an adjacent pixel, there is a problem of contamination of signal charges into the n-type semiconductor region 114 of the adjacent pixel. Therefore, in the potential design of the pixel 12, in addition to the relationship illustrated in FIG. 5, the potential of the channel portion of the transfer transistor M1 in an off-state is set to be lower than the potential between the n-type semiconductor region 114 and the n-type semiconductor region 114 of an adjacent pixel.

In one example, the potential between the n-type semiconductor region 114 and the n-type semiconductor region 114 of the adjacent pixel corresponds to the potential of the portion of the p-type semiconductor region 130. In this case, the potentials V5 and V7 have a relationship of V7>V5, where the potential of the portion of the p-type semiconductor region 130 to signal charges is V7.

According to the configuration described above, signal charges generated above the saturation charge amount during an accumulation period of charges in the photoelectric conversion unit PD do not move to the n-type semiconductor region 126 or the n-type semiconductor region 114 of the adjacent pixel but move to the n-type semiconductor region 116 of the pixel of interest. Therefore, for example, when a large amount of signal charges is generated in the n-type semiconductor region 126 of a defective pixel (white spot) having a large amount of a dark current, such contamination of signal charges from the defective pixel to the adjacent pixel can be prevented.

Therefore, according to the present embodiment, it is possible to effectively suppress an erroneous signal due to signal charges flowing from the adjacent pixel and acquire a high-quality image.

Second Embodiment

Figure 6:
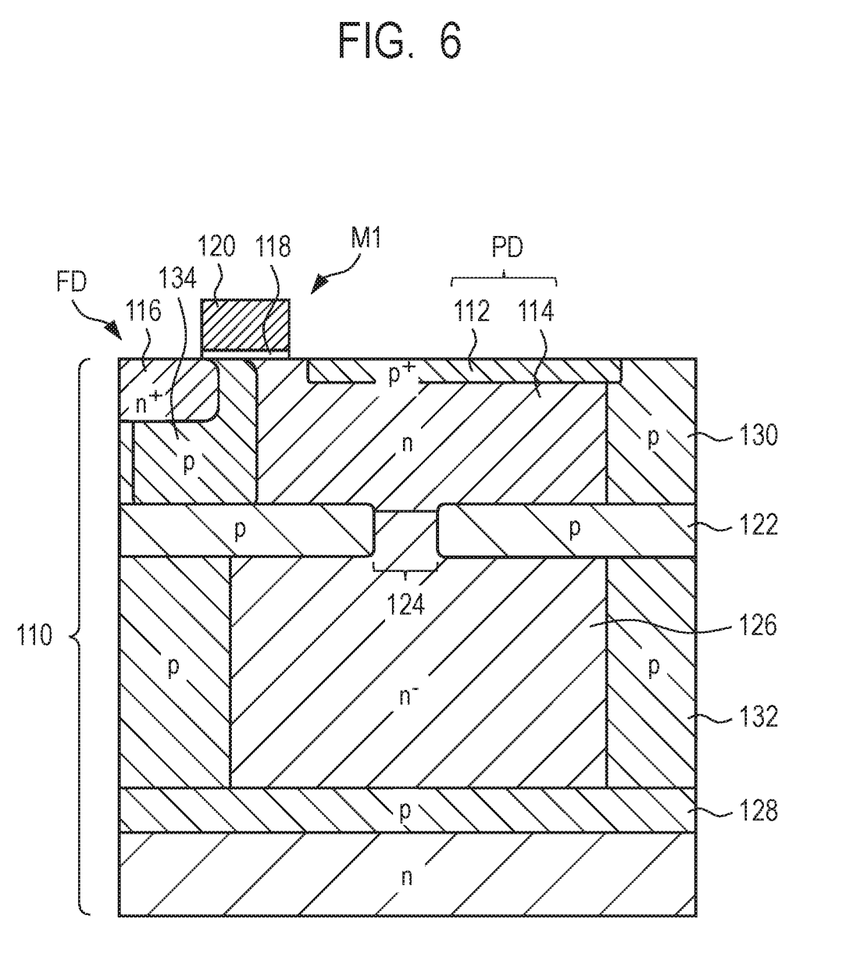
FIG. 6 is a schematic cross-sectional view illustrating the structure of a pixel of a solid-state imaging device according to a second embodiment of the present invention.

A solid-state imaging device according to a second embodiment of the present invention will be described with reference to FIG. 6. Components similar to those of the solid-state imaging devices according to the first embodiment are labeled with the same reference, and the description thereof will be omitted or simplified. FIG. 6 is a schematic cross-sectional view illustrating the structure of a pixel of the solid-state imaging device according to the present embodiment.

As illustrated in FIG. 6, the solid-state imaging device according to the present embodiment is the same as the solid-state imaging device according to the first embodiment except that the pixel 12 further includes a p-type semiconductor region 134 (ninth semiconductor region) between the n-type semiconductor region 114 and the n-type semiconductor region 116. The p-type semiconductor region 134 adjusts the potential between the n-type semiconductor region 114 and the n-type semiconductor region 116.

As described in the first embodiment, the potential of the channel portion of the transfer transistor M1 can be adjusted by the distance between the n-type semiconductor region 114 and the n-type semiconductor region 116. In some configurations of the pixel 12, however, it is also assumed that it is difficult to adjust the distance between the n-type semiconductor regions 114 and 116. For example, in a case where a pixel is reduced in size, and the distance between the n-type semiconductor regions 114 and 116 is short, the potential of the channel portion of the transfer transistor M1 may not be adjusted to a desired potential due to the distance between the n-type semiconductor regions 114 and 116.

For this point, in the solid-state imaging device according to the present embodiment, the p-type semiconductor region 134 is arranged between the n-type semiconductor region 114 and the n-type semiconductor region 116. Therefore, even when it is difficult to adjust the distance between the n-type semiconductor regions 114 and 116, with appropriate setting of the impurity concentration of the p-type semiconductor region 134, the potential of the channel portion of the transfer transistor M1 can be set to a desired value.

According to the configuration described above, signal charges generated above the saturation charge amount during an accumulation period of charges in the photoelectric conversion unit PD do not move to the n-type semiconductor region 126 or the n-type semiconductor region 114 of the adjacent pixel but move to the n-type semiconductor region 116 of the pixel of interest. Therefore, for example, when large amount of signal charges is generated in the n-type semiconductor region 126 of a defective pixel (white spot) having a large amount of a dark current, such contamination of signal charges from the defective pixel to the adjacent pixel can be prevented.

Therefore, according to the present embodiment, it is possible to effectively suppress an erroneous signal due to signal charges flowing from the adjacent pixel and acquire a high-quality image.

Third Embodiment

A solid-state imaging device and a method of driving the same according to a third embodiment of the present invention will be described with reference to FIG. 1 and FIG. 2.

A solid-state imaging device according to the present embodiment is the same as the solid-state imaging device according to the first or second embodiment except that an off-voltage of the transfer transistor M1 is configured to be variable. The off-voltage of the transfer transistor M1 can be controlled in accordance with a signal level of a control signal supplied from the vertical scanning circuit 20 to the gate of the transfer transistor M1 via the transfer gate signal line.

The distance between the n-type semiconductor region 114 and the n-type semiconductor region 116 is not necessarily constant due to manufacturing variation or the like. It is thus also assumed that the potential in the channel portion of the transfer transistor M1 changes as the distance between the n-type semiconductor region 114 and the n-type semiconductor region 116 changes. When the potential of the channel portion of the transfer transistor M1 increases above the potential between the n-type semiconductor region 114 and the n-type semiconductor region 114 of the adjacent pixel, a problem of contamination of signal charges into the n-type semiconductor region 114 of the adjacent pixel occurs. In particular, when such a potential change occurs in a defective pixel having a large amount of a dark current, a large amount of signal charges flows into the n-type semiconductor region 114 of the pixel adjacent to the defective pixel and causes degradation of an image.

From such a point of view, in the solid-state imaging device according to the present embodiment, the off-voltage of the transfer transistor M1 is configured to be variable. The potential of the channel portion of the transfer transistor M1 can also be adjusted by the off-voltage of the transfer transistor M1. That is, with the off-voltage of the transfer transistor M1 being set shallower (shifted to the higher voltage side in an n-type transistor), the potential of the channel portion of the transfer transistor M1 can be reduced. Further, with the off-voltage of the transfer transistor M1 being set deeper (shifted to the lower voltage side in an n-type transistor), the potential of the channel portion of the transfer transistor M1 can be increased.

For example, with the distance between the n-type semiconductor region 114 and the n-type semiconductor region 116 being longer, the potential of the channel portion of the transfer transistor M1 may be higher than the potential of the p-type semiconductor region 128, 130, or 132. In such a case, by adjusting the off-voltage of the transfer transistor M1 in the direction to be shallower, it is possible to reverse the potential relationship between the channel portion of the transfer transistor M1 and the p-type semiconductor region 128, 130, or 132.

Therefore, according to the present embodiment, it is possible to effectively suppress an erroneous signal due to signal charges flowing from the adjacent pixel and acquire a high-quality image.

Fourth Embodiment

Figure 7:
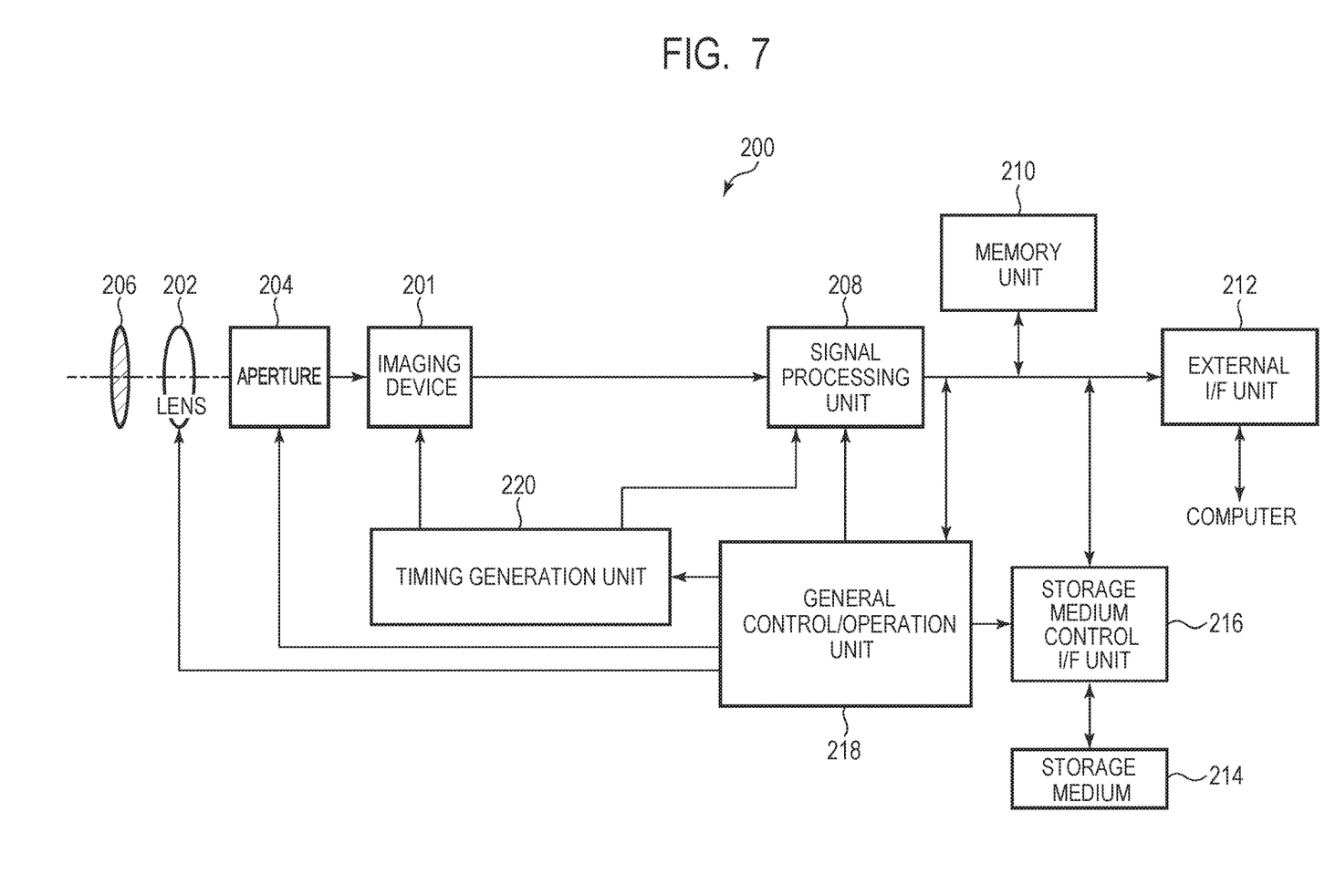
FIG. 7 is a block diagram illustrating the general configuration of an imaging system according to a fourth embodiment of the present invention.

An imaging system according to a fourth embodiment of the present invention will be described with reference to FIG. 7. FIG. 7 is a block diagram illustrating a general configuration of the imaging system according to the present embodiment.

The solid-state imaging device 100 described in the first to third embodiments described above can be applied to various imaging systems. Examples of applicable imaging systems may include a digital still camera, a digital camcorder, a surveillance camera, a copying machine, a fax machine, a mobile phone, an on-vehicle camera, an observation satellite, and the like. In addition, a camera module including an optical system such as a lens and an imaging device is also included in the imaging system. FIG. 7 illustrates a block diagram of a digital still camera as an example out of these examples.

The imaging system 200 illustrated as an example in FIG. 7 includes an imaging device 201, a lens 202 that captures an optical image of a subject onto the imaging device 201, an aperture 204 for changing a light amount passing through the lens 202, and a barrier 206 for protecting the lens 202. The lens 202 and the aperture 204 form an optical system that converges a light onto the imaging device 201. The imaging device 201 is the solid-state imaging device 100 described in any of the first to third embodiments and converts an optical image captured by the lens 202 into image data.

The imaging system 200 further includes a signal processing unit 208 that processes an output signal output from the imaging device 201. The signal processing unit 208 preforms A/D conversion to convert an analog signal output by the imaging device 201 into a digital signal. In addition, the signal processing unit 208 performs various correction and compression other than the above, if necessary, and outputs image data. An A/D conversion unit, which is a part of the signal processing unit 208, may be formed on a semiconductor substrate on which the imaging device 201 is provided or may be formed on a different semiconductor substrate from the semiconductor substrate on which the imaging device 201 is provided. Further, the imaging device 201 and the signal processing unit 208 may be formed on the same semiconductor substrate.

The imaging system 200 further includes a memory unit 210 for temporarily storing image data therein and an external interface unit (external I/F unit) 212 for communicating with an external computer or the like. The imaging system 200 further includes a storage medium 214 such as a semiconductor memory for performing storage or readout of imaging data and a storage medium control interface unit (storage medium control I/F unit) 216 for performing storage or readout on the storage medium 214. Note that the storage medium 214 may be embedded in the imaging system 200 or may be removable.

The imaging system 200 further includes a general control/operation unit 218 that controls various operations and the entire digital still camera and a timing generation unit 220 that outputs various timing signals to the imaging device 201 and the signal processing unit 208. Here, the timing signal or the like may be input from the outside, and the imaging system 200 may include at least the imaging device 201 and the signal processing unit 208 that processes an output signal output from the imaging device 201.

The imaging device 201 outputs an imaging signal to the signal processing unit 208. The signal processing unit 208 performs predetermined signal processing on an imaging signal output from the imaging device 201 and outputs image data. The signal processing unit 208 uses an imaging signal to generate an image.

As discussed above, according to the present embodiment, the imaging system to which the solid-state imaging device 100 according to the first to third embodiments is applied can be realized.

Fifth Embodiment

Figure 8A:
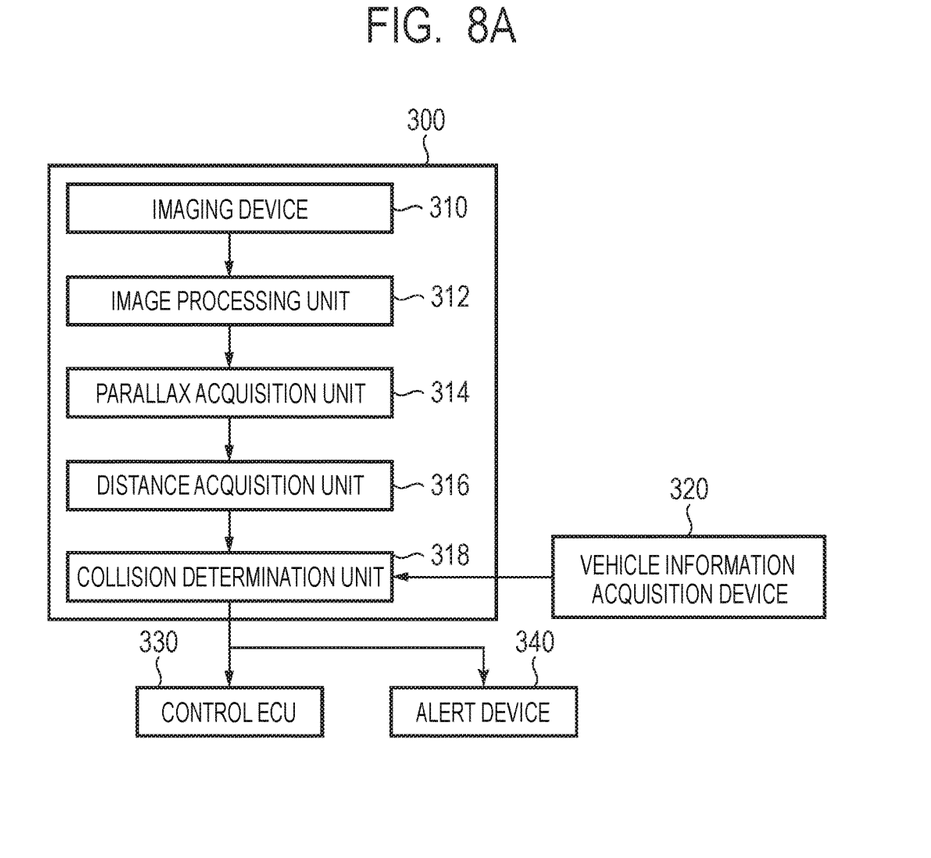
FIG. 8A is a diagram illustrating a configuration example of an imaging system according to a fifth embodiment of the present invention.
Figure 8B:
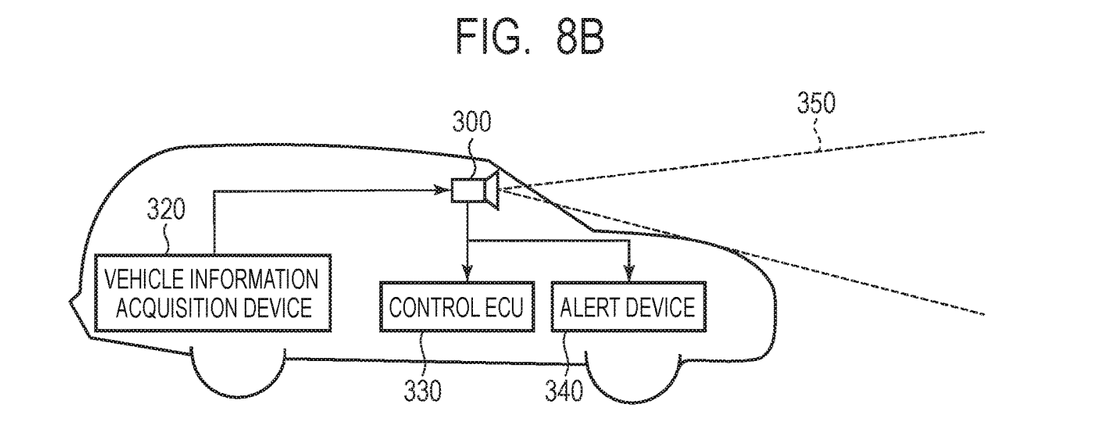
FIG. 8B is a diagram illustrating a configuration example of a movable object according to the fifth embodiment of the present invention.

An imaging system and a movable object according to a fourth embodiment of the present invention will be described by using FIG. 8A and FIG. 8B. FIG. 8A is a diagram illustrating a configuration of an imaging system according to the present embodiment. FIG. 8B is a diagram illustrating a configuration of a movable object according to the present embodiment.

FIG. 8A illustrates an example of an imaging system related to an on-vehicle camera. The imaging system 300 includes an imaging device 310. The imaging device 310 is the solid-state imaging device 100 described in any of the first to third embodiments described above. The imaging system 300 includes an image processing unit 312 that performs image processing on a plurality of image data acquired by the imaging device 310 and a parallax acquisition unit 314 that calculates a parallax (a phase difference of parallax images) from the plurality of image data acquired by the imaging system 300. Further, the imaging system 300 includes a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 8B illustrates the imaging system when a front area of a vehicle (a capturing area 350) is captured. The vehicle information acquisition device 320 transmits an instruction to the imaging system 300 or the imaging device 310. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Further, while the case where electrons are used as signal charges has been illustrated as an example in the embodiments described above, signal charges may be holes. In such a case, the conductivity types of the semiconductor regions described above are reversed, and signal levels supplied to transistors are inverted.

Further, the imaging systems illustrated in the fourth and fifth embodiments described above are examples of an imaging system to which the photoelectric conversion device of the present invention may be applied, and an imaging system to which the photoelectric conversion device of the present invention can be applied is not limited to the configuration illustrated in FIG. 7 and FIG. 8A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-142744, filed Jul. 30, 2018, which is hereby incorporated by reference herein in its entirety.

What is claimed is:

1. A solid-state imaging device comprising:
a plurality of pixels each including a photoelectric conversion unit that generates charges by photoelectric conversion, a charge holding portion that holds charges transferred from the photoelectric conversion unit, and a transfer transistor; and a pixel isolation portion provided between each of the plurality of pixels, wherein the photoelectric conversion unit includes a first semiconductor region of a first conductivity type provided in a semiconductor substrate and configured to accumulate generated charges, a second semiconductor region of a second conductivity type provided under the first semiconductor region, and a third semiconductor region of the first conductivity type provided under the second semiconductor region and having a lower impurity concentration than the first semiconductor region, and the first semiconductor region is electrically connected to the third semiconductor region via a fourth semiconductor region provided at the same depth as the second semiconductor region, wherein the charge holding portion includes a fifth semiconductor region of the first conductivity type, wherein the transfer transistor has a region between the first semiconductor region and the fifth semiconductor region as a channel portion, wherein the pixel isolation portion includes a sixth semiconductor region of the second conductivity type provided between the third semiconductor region of one of the plurality of pixels and the third semiconductor region of a pixel adjacent to the one of the plurality of pixels, and wherein a relationship of V6>V5>V4 is satisfied, where a potential of the fourth semiconductor region to the charges is V4, a potential of a region having the highest potential to the charges in the channel portion with the transfer transistor being in an off-state is V5, and a potential of the sixth semiconductor region to the charges is V6.

2. The solid-state imaging device according to claim 1, wherein the pixel isolation portion further includes a seventh semiconductor region of the second conductivity type provided between the first semiconductor region of one of the plurality of pixels and the first semiconductor region of a pixel adjacent to the one of the plurality of pixels, and wherein a relationship of V7>V5 is satisfied, where a potential of the seventh semiconductor region to the charges is V7.

3. The solid-state imaging device according to claim 1, wherein each of the plurality of pixels further includes an eighth semiconductor region of the second conductivity type provided under the third semiconductor region, and wherein a relationship of V8>V5 is satisfied, where a potential of the eighth semiconductor region to the charges is V8.

4. The solid-state imaging device according to claim 2, wherein each of the plurality of pixels further includes an eighth semiconductor region of the second conductivity type provided under the third semiconductor region, and wherein a relationship of V8>V5 is satisfied, where a potential of the eighth semiconductor region to the charges is V8.

5. The solid-state imaging device according to claim 1, wherein a potential between the first semiconductor region and the fifth semiconductor region is defined by a distance between the first semiconductor region and the fifth semiconductor region.

6. The solid-state imaging device according to claim 1 further comprising a ninth semiconductor region of the second conductivity type provided between the first semiconductor region and the fifth semiconductor region, wherein a potential between the first semiconductor region and the fifth semiconductor region is defined by an impurity concentration of the ninth semiconductor region.

7. The solid-state imaging device according to claim 2 further comprising a ninth semiconductor region of the second conductivity type provided between the first semiconductor region and the fifth semiconductor region, wherein a potential between the first semiconductor region and the fifth semiconductor region is defined by an impurity concentration of the ninth semiconductor region.

8. The solid-state imaging device according to claim 1, wherein the fourth semiconductor region overlaps with at least a part of the first semiconductor region in a plan view.

9. The solid-state imaging device according to claim 2, wherein the fourth semiconductor region overlaps with at least a part of the first semiconductor region in a plan view.

10. The solid-state imaging device according to claim 3, wherein the fourth semiconductor region overlaps with at least a part of the first semiconductor region in a plan view.

11. The solid-state imaging device according to claim 4, wherein the fourth semiconductor region overlaps with at least a part of the first semiconductor region in a plan view.

12. The solid-state imaging device according to claim 5, wherein the fourth semiconductor region overlaps with at least a part of the first semiconductor region in a plan view.

13. The solid-state imaging device according to claim 6, wherein the fourth semiconductor region overlaps with at least a part of the first semiconductor region in a plan view.

14. The solid-state imaging device according to claim 7, wherein the fourth semiconductor region overlaps with at least a part of the first semiconductor region in a plan view.

15. The solid-state imaging device according to claim 1, wherein the fourth semiconductor region is arranged in the center of the first semiconductor region in a plan view.

16. The solid-state imaging device according to claim 1, wherein the photoelectric conversion unit further includes a tenth semiconductor region of the second conductivity type provided on a surface portion of the semiconductor substrate and forming a p-n junction between the photoelectric conversion unit and the first semiconductor region.

17. The solid-state imaging device according to claim 1, wherein the fourth semiconductor region is a semiconductor region of the first conductivity type.

18. The solid-state imaging device according to claim 1, wherein the fourth semiconductor region is a semiconductor region of the second conductivity type.

19. An imaging system comprising:
the solid-state imaging device according to claim 1; and
a signal processing unit that processes a signal output from each of the plurality of pixels of the solid-state imaging device.

20. A movable object comprising:
the solid-state imaging device according to claim 1;
a distance information acquisition unit that acquires distance information on a distance to an object, from a parallax image based on signals from the solid-state imaging device; and
a control unit that controls the movable object based on the distance information.

* * * * *